(12) United States Patent
Tao et al.

(10) Patent No.: US 8,299,481 B2
(45) Date of Patent: Oct. 30, 2012

(54) WAFER-SCALED LIGHT-EMITTING STRUCTURE

(75) Inventors: Chin-San Tao, Hsinchu (TW);
Tzu-Chien Hsu, Hsinchu (TW);
Tsen-Kuei Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 220 days.

(21) Appl. No.: 12/533,196

(22) Filed: Jul. 31, 2009

(65) Prior Publication Data

US 2010/0025713 A1 Feb. 4, 2010

(30) Foreign Application Priority Data

Aug. 1, 2008 (TW) .............................. 97129479 A

(51) Int. Cl.
*H01L 33/00* (2010.01)
(52) U.S. Cl. .................. 257/98; 438/22; 257/E33.005
(58) Field of Classification Search .................. 257/98, 257/E33.005; 438/22
See application file for complete search history.

(56) References Cited

U.S. PATENT DOCUMENTS

| 4,830,984 | A | 5/1989 | Purdes |
| 6,787,435 | B2 * | 9/2004 | Gibb et al. ..................... 438/507 |
| 7,198,671 | B2 | 4/2007 | Ueda |
| 2008/0164467 | A1 * | 7/2008 | Sano et al. ...................... 257/43 |

FOREIGN PATENT DOCUMENTS

TW 415117 12/2000

OTHER PUBLICATIONS

Po-Kai Chiu, ITRC—Instrument Technology Research Center, published Oct. 31, 2006.

* cited by examiner

*Primary Examiner* — Steven J Fulk
(74) *Attorney, Agent, or Firm* — Muncy, Geissler, Olds & Lowe, PLLC

(57) ABSTRACT

This invention discloses a wafer-scaled light-emitting structure comprising a supportive substrate; an anti-deforming layer; a bonding layer; and a light-emitting stacked layer, wherein the anti-deforming layer reduces or removes the deformation like warp caused by thinning of the substrate.

12 Claims, 6 Drawing Sheets

```
┌─────────────────────────────────────────┐
│ connecting the light-emitting stacked layer │
│ and the anti-deforming layer by the     │
│ adhesive layer                          │
└─────────────────────────────────────────┘
                    │
                    ▼
┌─────────────────────────────────────────┐
│      removing the growth substrate      │
└─────────────────────────────────────────┘
                    │
                    ▼
┌─────────────────────────────────────────┐
│   forming a protective layer on the     │
│   light-emitting stacked layer          │
└─────────────────────────────────────────┘
                    │
                    ▼
┌─────────────────────────────────────────┐
│      thinning the supportive substrate  │
└─────────────────────────────────────────┘
```

WAFER-SCALED LIGHT-EMITTING STRUCTURE

TECHNICAL FIELD

The present invention relates to a wafer-scaled light-emitting structure, especially to the wafer-scaled light-emitting structure having an anti-deforming layer.

REFERENCE TO RELATED APPLICATION

This application claims the right of priority based on TW application Ser. No. 097129479, filed "Aug. 1, 2008", entitled "WAFER-SCALED LIGHT-EMITTING STRUCTURE" and the contents of which are incorporated herein by reference.

BACKGROUND

A light emitting diode (LED) is a solid-state semiconductor element including at least a p-n junction. The p-n junction is formed between a p-type and an n-type semiconductor layers. When the p-n junction receives a suitable bias, the holes of the p-type semiconductor layer and the electrons of the n-type semiconductor layer are combined to emit light. Generally, the region emitting light is called a light-emitting region.

The characteristics of LEDs are small dimensions, high lighting efficiency, long lifetime, quick reaction, high reliability, and great chromaticity so LEDs have been applied widely in electronic devices, motor, signboard, traffic signals, and so on. With its full color spectrum, LEDs have been gradually replacing conventional lighting apparatus such as fluorescent lamps and incandescent lamps.

A liquid crystal display (LCD) has been utilized in variable kinds of electronic devices like the desktop computer or the laptop, the mobile phone, and the screens of the global positioning system (GPS) and the television. In general, the back light unit (BLU) provides a light source for LCD, and LED is one of the main light sources of the BLU. When the dimensions of the display tend toward smaller, the thinner thickness of the LED is preferred.

SUMMARY

The present application provides a wafer-scaled light-emitting structure, including a supportive substrate; an anti-deforming layer on the supportive substrate; a bonding layer on the anti-deforming layer; and a light-emitting stacked layer on the bonding layer, wherein the anti-deforming layer can reduce or remove the deformation caused by thinning of the substrate.

The present application provides a method of manufacturing a wafer-scaled light-emitting structure, including providing a supportive substrate; forming an anti-deforming layer on the supportive substrate; forming a light-emitting stacked layer on a growth substrate; forming a reflective layer on the light-emitting stacked layer; connecting the reflective layer and the anti-deforming layer by a bonding layer; removing the growth substrate; forming a protective layer on the light-emitting stacked layer; and thinning the supportive substrate. The method further includes forming a reflective layer between the bonding layer and the light-emitting stacked layer, or forming a protective layer on the light-emitting stacked layer or the supportive substrate.

BRIEF DESCRIPTION OF THE DRAWINGS

FIGS. 5A-5B show a flow chart of a method of manufacturing a wafer-scaled light-emitting structure of the present application.

DETAILED DESCRIPTION

Figure 1A:
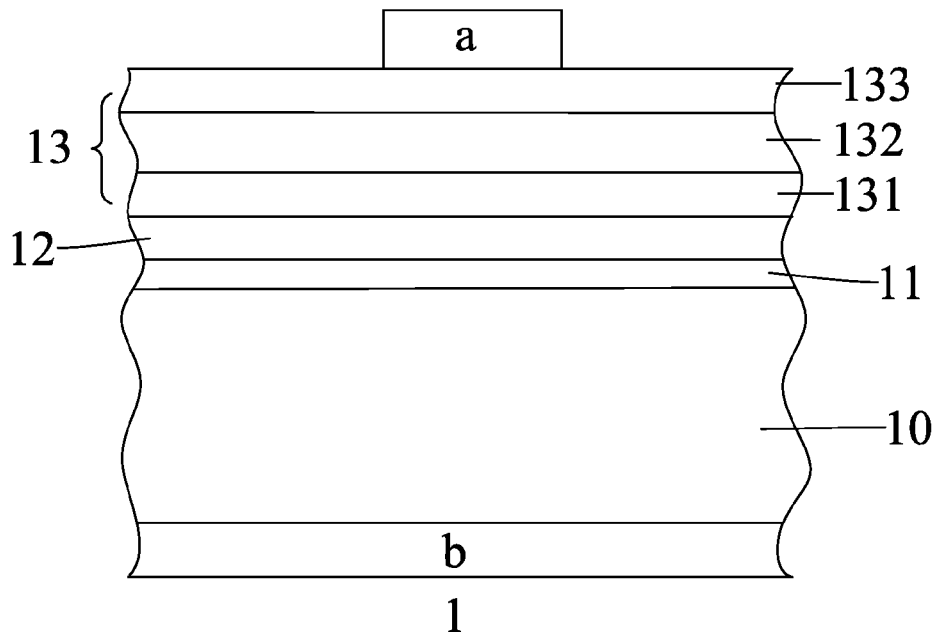
FIG. 1A shows a cross-sectional view of an embodiment of a wafer-scaled light-emitting structure of the present application.

FIG. 1A shows a cross-sectional view of an embodiment of a wafer-scaled light-emitting structure of the present application. A wafer-scaled light-emitting structure 1 includes a supportive substrate 10; an anti-deforming layer 11 on the supportive substrate 10; a bonding layer 12 on the anti-deforming layer 11; a light-emitting stacked layer 13 on the bonding layer 12, wherein the anti-deforming layer 11 can reduce and/or remove the deformation caused by thinning of the supportive substrate 10.

The supportive substrate 10 supports the light-emitting stacked layer 13 after removing a growth substrate of the light-emitting stacked layer 13. The materials of the supportive substrate 10 can include but is not limited to metal, electrical insulating material, composite material, Metal Matrix Composite (MMC), Ceramic Matrix Composite (CMC), Si, IP, ZnSe, AlN, GaAs, SiC, GaP, GaAsP, Sapphire, ZnSe, ZnO, InP, LiGaO$_2$, LiAlO$_2$, or the combination thereof. After thinning the supportive substrate 10, the thickness thereof is smaller than about 70 μm, better smaller than about 40 μm, preferably smaller than 20 μm. The thinning means reducing the thickness. For example, the surface of the supportive substrate 10 opposite to and far away from the light-emitting stacked layer 13 is polished so the thickness of the supportive substrate 10 is reduced from 300 μm to 40 μm.

Figure 1B:
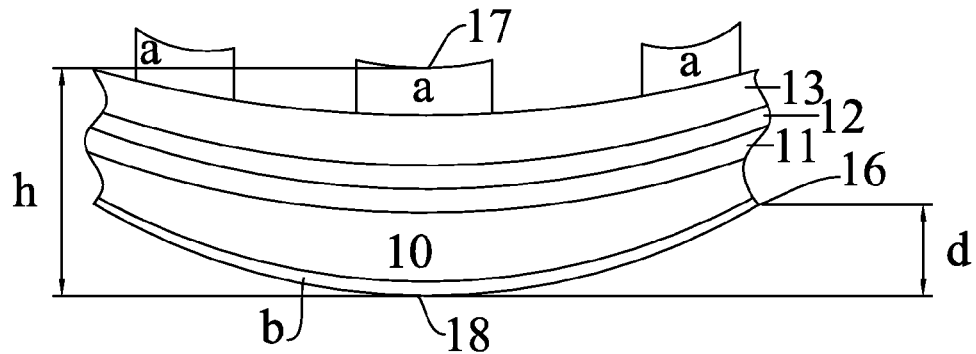
FIG. 1B-1C show cross-sectional views of the deformation of the embodiments of a wafer-scaled light-emitting structure of the present application.
Figure 1C:
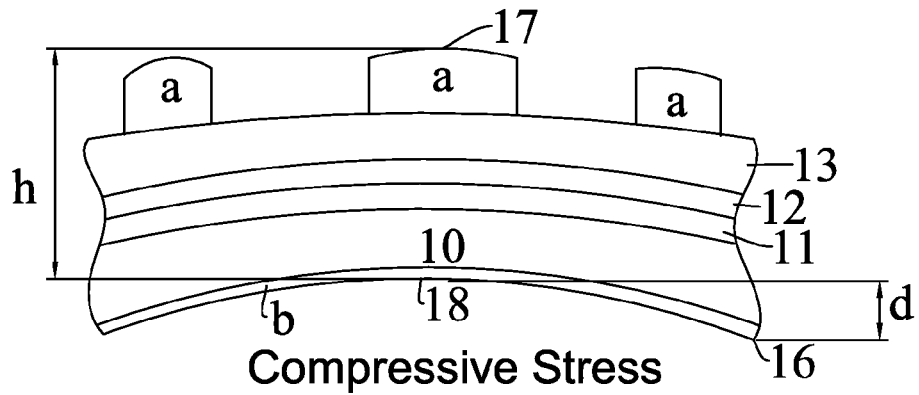

The anti-deforming layer 11 contains a resistant stress to reduce the sum of the whole stress of the wafer-scaled light-emitting structure 1 after thinning the supportive substrate 10 in order to reduce or remove the deformation. The generation of the resistant stress results from the deposition defect of the molecules or the microcosmic structure of the anti-deforming layer 11. For example, because the lattice shapes of the supportive substrate 10 and the anti-deforming layer 11 are different, the lattice mismatch is generated when the molecules bond to each other. In addition, the stacking of the molecules can form holes to result in mismatch of the molecules during the deposition process so the resistant stress can also be generated. As shown in FIG. 1B, for example, when the supportive substrate 10 is sapphire, normally the thickness is 300 μm. However, for particular purposes like heat-dissipation, the supportive substrate 10 needs to be thinned. The thinned supportive substrate 10 can generate a stress like tensile stress to warp the supportive substrate 10 concavely so a deforming height d is generated. When the conventional wafer-scaled light-emitting structure does not include the anti-deforming layer 11, the deforming height d is larger. For example, the deforming height d is about 1 cm that is about 200 times of a thickness h of the conventional wafer-scaled light-emitting structure. Therefore, the yield of the sequential chip process like the dicing, the breaking, or the packaging can be influenced. The deforming height d is the height from a geometry center of the bottom surface 18 to a border of the bottom surface and the lateral side of the wafer-scaled light-emitting structure 1. The thickness h is the distance between a geometry center of the top surface 17 and the geometry center of the bottom surface 18. Taking a circular wafer as an example in this embodiment, the geometry center of the top surface 17 and the geometry center of the bottom surface 18 can be the centers of the circles of the top surface and the bottom surface of the wafer respectively. The resistant stress of the anti-deforming layer 11 of the wafer-scaled light-emitting structure 1 is a compressive stress to reduce the deforming height d to be at most about 10 times of the thickness h of the wafer-scaled light-emitting structure 1, better is about 5 times, preferable 0 time, for reducing or removing the deformation. When the thickness h of the wafer-scaled light-emitting structure 1 is 50 μm, the anti-deforming layer 11 can restrain the deforming height d within 500 μm. The material of the anti-deforming layer 11 can be GaN. However, in view of the material of the supportive substrate 10, thinning the supportive substrate 10 can also generate a compressive stress to force the supportive substrate 10 to become a convex as shown in FIG. 1C. Therefore, the material of the anti-deforming layer 11 which can generate a tensile stress should be selected to reduce or remove the deformation of the supportive substrate 10. The thickness of the anti-deforming layer 11 can be smaller than about 30 μm, preferably is smaller than about 10 μm and larger than about 2 μm, and preferably larger than 3 μm. The anti-deforming layer 11 can be deposited on the support substrate 10 by CVD, MOCVD, VPE, LPE, MBE, PECVD, or other known deposition technologies. The material of the anti-deforming layer 11 can include but is unlimited to $Al_xO_y$, $SiN_x$, $SiO_x$, $TiO_x$, GaN, or the combination thereof.

The bonding layer 12 is utilized to connect the supportive substrate 10 and the light-emitting stacked layer 13, and can be metal materials or non-metal materials. If the bonding layer 12 is a metal material, it can have the function of reflection. The material of the bonding layer 12 includes but is not limited to PI, BCB, PFCB, Epoxy, other organic adhesive materials, In, Sn, Al, Au, Pt, Zn, Ag, Ti, Pb, Pd, Ge, Cu, Ni, AuSn, InAg, InAu, AuBe, AuGe, AuZn, PbSn, PdIn, or the combination thereof.

The light-emitting stacked layer 13 at least includes a first cladding layer 131 located on the bonding layer 12, an active layer 132 located on the first cladding layer 131, and a second cladding layer 133 located on the active layer 132. The first cladding layer 131 can be i-type, p-type, or n-type semiconductors and the conductivity of the second cladding layer 133 is different from that of the first cladding layer 131. The structure of the active layer 132 can be single heterostructure (S H), double heterostructure (DH), double-side double heterostructure (DDH), or multi-quantum well (MQW). The material of the active layer 132 can include but is not limited to II-VI group semiconductors, CdZnSe, or III-V group semiconductors, like AlGaInP, AlN, GaN, AlGaN, InGaN, or AlInGaN.

Figure 1D:
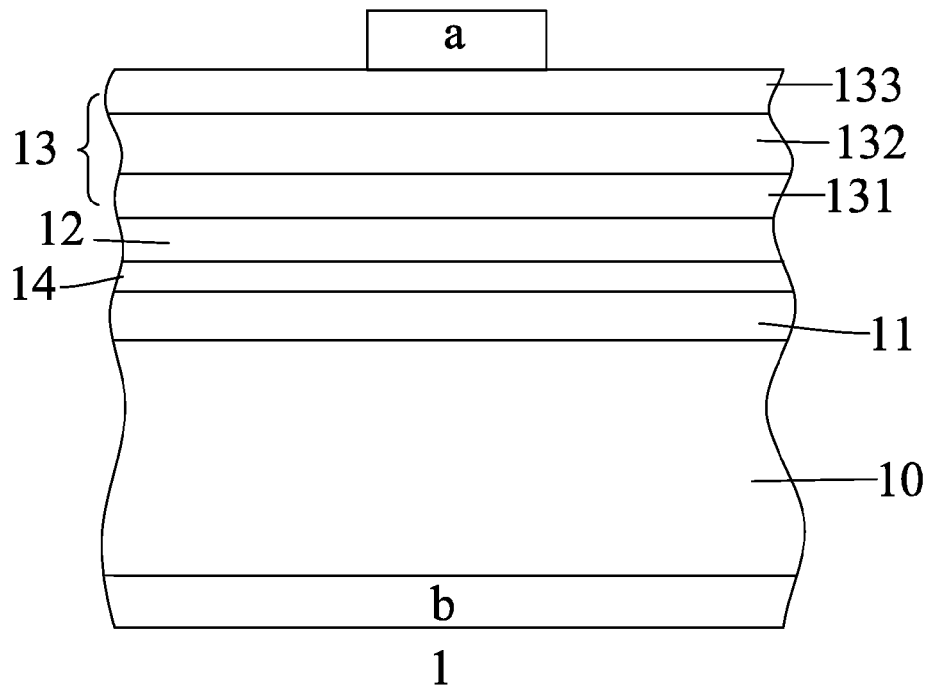
FIG. 1D-1E show cross-sectional views of the embodiments of a wafer-scaled light-emitting structure of the present application.

Referring to FIG. 1D, the wafer-scaled light-emitting structure 1 further includes a reflective layer 14 located between the light-emitting stacked layer 13 and the bonding layer 12 or the anti-deforming layer 11 and the bonding layer 12 to reflect the light emitted from the light-emitting stacked layer 13. The material of the reflective layer 14 can include but is not limited to In, Sn, Al, Au, Pt, Zn, Ag, Ti, Pb, Ge, Cu, Ni, AuBe, AuGe, AuZn, PbSn, the combination thereof, or the DBR.

The wafer-scaled light-emitting structure 1 further includes a first pad a located on the second cladding layer 133 and a second pad b located under the supportive substrate 10 when the supportive substrate 10 is a conductor preferably. The first pad a and the second pad b electrically connect with the light-emitting stacked layer 13 and the supportive substrate 10 respectively. When the first pad a and the second pad b are located on different sides of the supportive substrate 10 respectively, the wafer-scaled light-emitting structure 1 is a vertical structure.

Figure 1E:
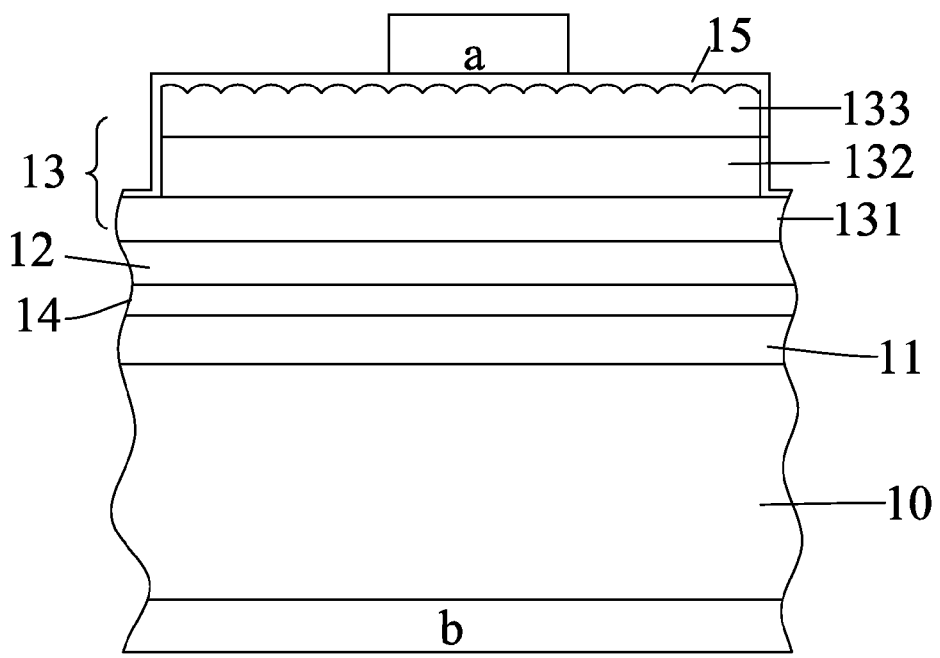

Referring to FIG. 1E, the surface of the second cladding layer 133 can be roughened to form a rough surface to improve light extraction efficiency. A protective layer 15 is formed on the light-emitting stacked layer 13, surrounds the lateral walls of the first pad a, and extends outwardly along the light-emitting stacked layer 13 to protect the light-emitting stacked layer 13 and other structures thereunder from moisture, shock, or short caused by wiring. The material of the protective layer 15 includes but is not limited to dielectric material, Su8, BCB, PFCB, Epoxy, Acrylic Resin, COC, PMMA, PET, PC, Polyetherimide, Fluorocarbon Polymer, Silicone, Glass, $Al_xO_y$, $SiO_x$, $SiN_x$, $TiO_2$, SOG, the combination thereof, or other transparent materials.

Figure 2A:
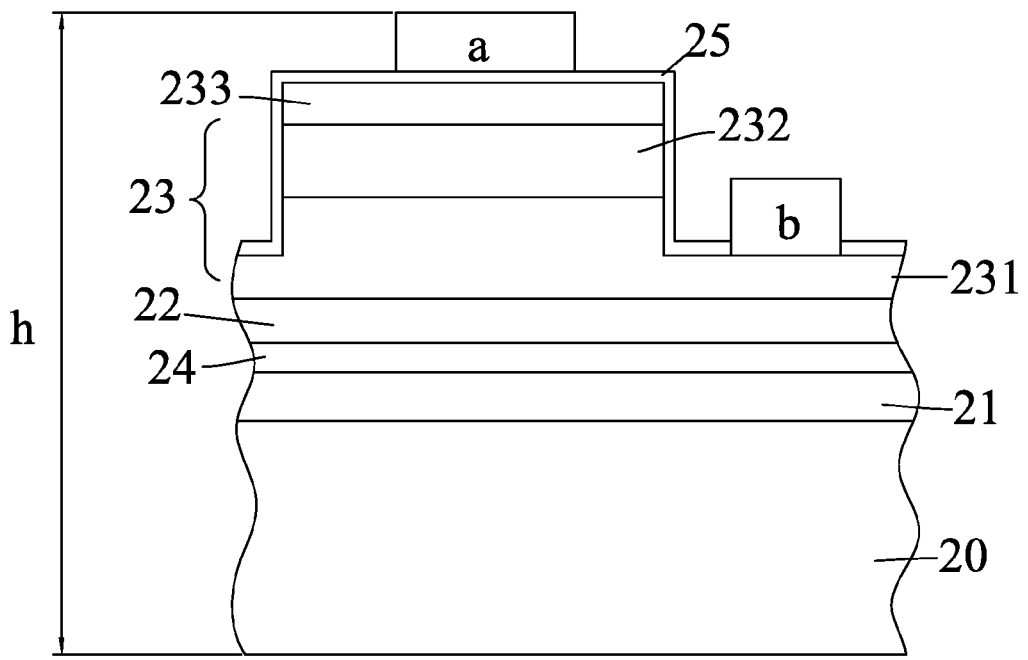
FIG. 2A-2B show cross-sectional views of other embodiments of the wafer-scaled light-emitting structure of the present application.

Another embodiment of a wafer-scaled light-emitting structure 2 as shown in FIG. 2A includes a supportive substrate 20; an anti-deforming layer 21 located on the supportive substrate 20; a reflective layer 24 located on the anti-deforming layer 21; a bonding layer 22 located on the reflective layer 24; a light-emitting stacked layer 23 located on the reflective layer 24; and a protective layer 25 located on the light-emitting stacked layer 23, wherein the anti-deforming layer 21 can reduce or remove the deformation caused by thinning of the substrate.

The supportive substrate 20 supports the light-emitting stacked layer 23 after removing a growth substrate of the light-emitting stacked layer 23. After thinning the supportive substrate 20, the thickness thereof is smaller than about 70 μm, better is smaller than about 40 μm, preferably is smaller than 20 μm. The thinning means reducing the thickness. For example, the thickness of the supportive substrate 20 is reduced from 300 μm to 40 μm. The anti-deforming layer 21 contains a resistant stress to reduce the sum of the whole stress of the wafer-scaled light-emitting structure 2 after thinning the supportive substrate 20 in order to reduce or remove the deformation. In this embodiment, the thickness of the anti-deforming layer 21 can be smaller than about 30 μm, preferably is smaller than about 10 μm and larger than about 2 μm, and preferably is larger than 3 μm. The thinned supportive substrate 20 can generate a deforming height. When the conventional wafer-scaled light-emitting structure does not include the anti-deforming layer 21, the deforming height is larger. For example, the deforming height is about 1 cm that is about 200 times of a thickness of the conventional wafer-scaled light-emitting structure. The deforming height is the height from a geometry center of the bottom surface to a border of the bottom surface and the lateral side of the wafer-scaled light-emitting structure 2. The thickness h is the distance between a geometry center of the top surface and the geometry center of the bottom surface. Taking a circular wafer as an example in this embodiment, the geometry center of the top surface and the geometry center of the bottom surface can be the centers of the circles of the top surface and the bottom surface of the wafer respectively. The anti-deforming layer 21 can reduce the deforming height to be at most about 10 times of the thickness of the wafer-scaled light-emitting structure 2, better is about 5 times, preferably is about 0 time, for reducing or removing the deformation. When the thickness of the wafer-scaled light-emitting structure 2 is 50 µm, the anti-deforming layer 21 can restrain the deforming height within 500 µm. The bonding layer 22 is utilized to connect the supportive substrate 20 and the light-emitting stacked layer 23, and can be metal materials or non-metal materials. The reflective layer 24 can reflect the light emitted from the light-emitting stacked layer 23. The protective layer 25 is formed on the light-emitting stacked layer 23, surrounds the lateral walls of a first pad a and a second pad b, and extends outwardly along the light-emitting stacked layer 23 to protect the light-emitting stacked layer 23 and other structures thereunder from moisture, shock, or short caused by wiring.

Figure 2B:
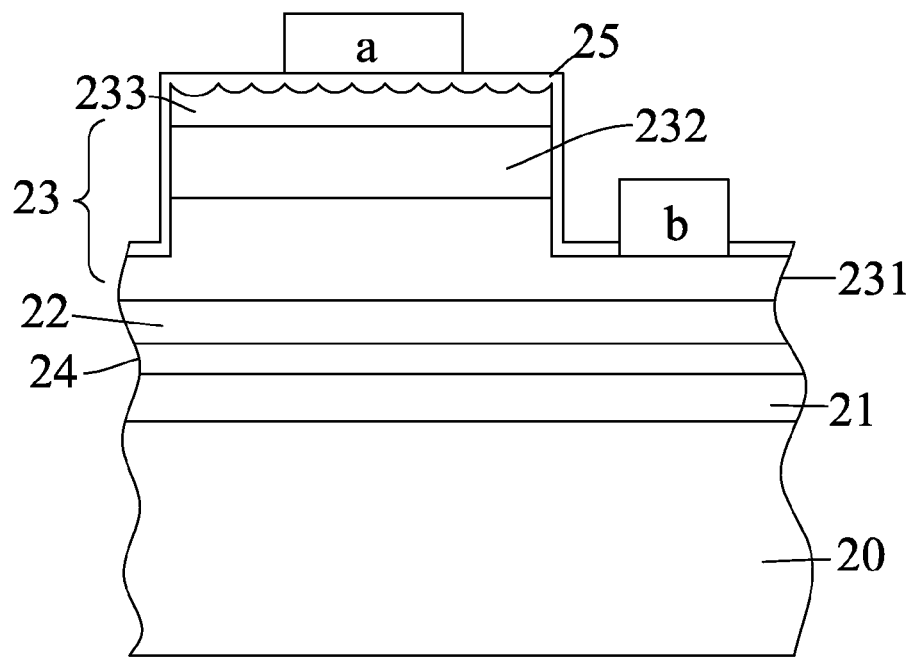

The light-emitting stacked layer 23 at least includes a first cladding layer 231, an active layer 232, and a second cladding layer 233. When the light-emitting stacked layer 23 is etched to expose a part of the first cladding layer 231, the first pad a is located on the second cladding layer 233 and the second pad b is located on the exposed part of the first cladding layer 231. The supportive substrate 20 is preferably insulating. For example, it can be an insulator or a conductor which is covered by an insulating layer. Referring to FIG. 2B, the surface of the second cladding layer 233 can be roughened to form a rough surface to improve light extraction efficiency. When the first pad a and the second pad b are located on the same side of the supportive substrate 20, the wafer-scaled light-emitting structure 2 is a horizontal structure.

Figure 3:
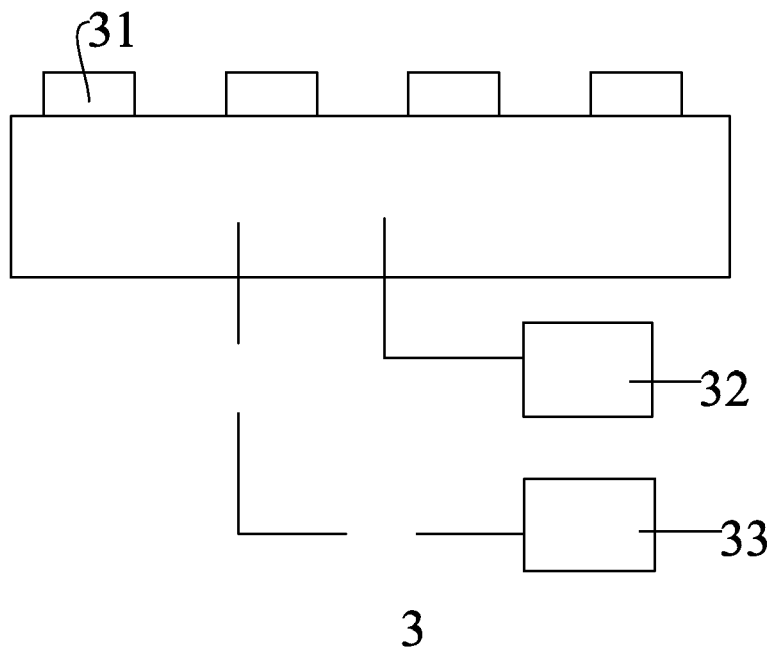
FIG. 3 shows a schematic view of a light source generation device formed by a chip from dicing the wafer-scaled light-emitting structure of the present application.

FIG. 3 shows a schematic view of a light source device 3. It includes a chip which is formed by dicing a wafer-scaled light-emitting structure in each of these embodiments of the present application. The light source device 3 can be an illuminating device such as a streetlight, a vehicle light, or indoor light source, a traffic light, or a backlight source of a BLU of a panel display. The light source device 3 includes a light source 31 composed of the aforementioned chip, a power supply system 32 offering a current to the light source 31, and a control element 343 to control the power supply system 32.

Figure 4:
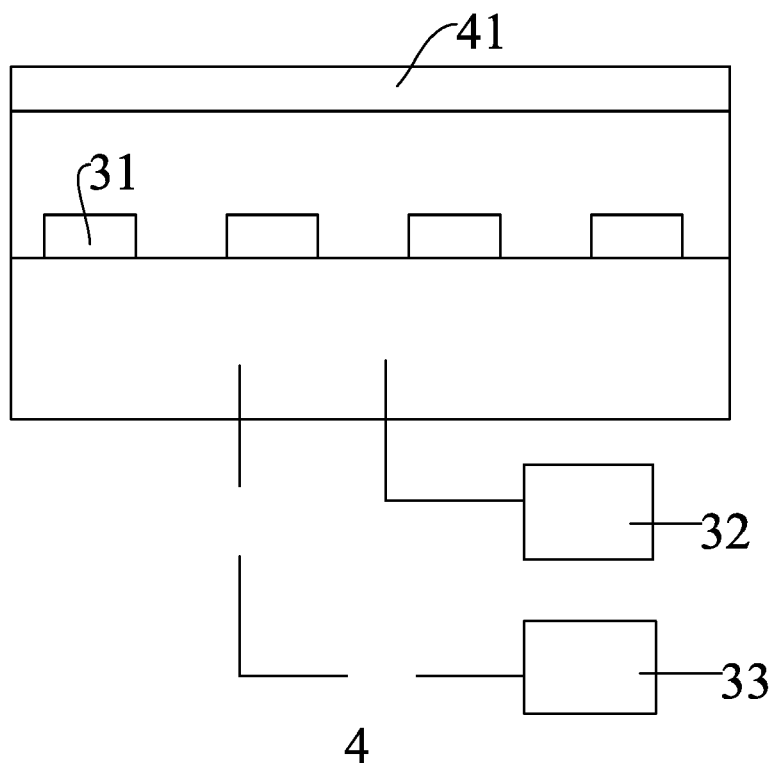
FIG. 4 shows a schematic view of a BLU formed by a chip from dicing the wafer-scaled light-emitting structure of the present application.

FIG. 4 shows a schematic view of a BLU 4. It includes the aforementioned light source device 3 and an optical element 41. The optical element 41 processes the light form the light source device 3 to apply to the panel display. For example, the optical element 41 can diffuse the light from the light source device 3.

Figure 5A:
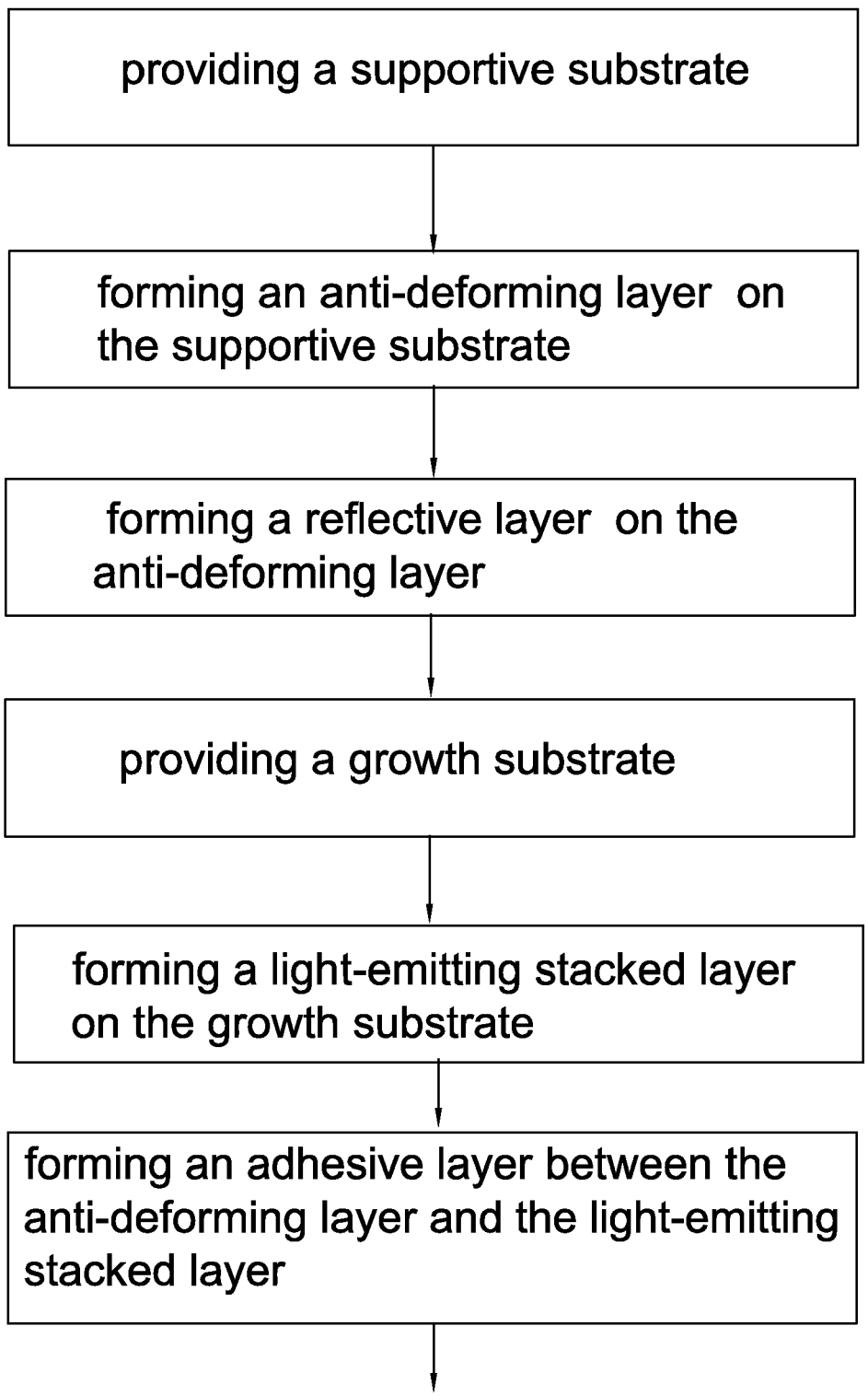

FIGS. 5A-5B show a flow chart of a method of manufacturing a wafer-scaled light-emitting structure 1. The method includes providing a supportive substrate 10; forming an anti-deforming layer 11 on the supportive substrate 10; forming a reflective layer 14 on the anti-deforming layer 11; forming a light-emitting stacked layer 13 on a growth substrate; connecting the reflective layer 14 and the light-emitting stacked layer 13 by a bonding layer 12; removing the growth substrate; forming a protective layer 15 on the light-emitting stacked layer 13; thinning the supportive substrate 10; and dicing the wafer to form chips. In addition, a reflective layer 14 can also be formed between the light-emitting stacked layer 13 and the bonding layer 12. After the reflective layer 14 is formed on the light-emitting stacked layer 13, the bonding layer 12 connects the reflective layer 14 and the anti-deforming layer 11. The bonding layer 12 can be formed on the anti-deforming layer 11 and the light-emitting stacked layer 13 respectively and then connect the anti-deforming layer 11 and the light-emitting stacked layer 13. The anti-deforming layer 11 can be deposited on the supportive substrate 10 by CVD, MOCVD, VPE, LPE, MBE, PECVD, or other known deposition technologies. The material of anti-deforming layer 11 can include but is not limited to $Al_xO_y$, $SiN_x$, $SiO_x$, $TiO_x$, GaN, or the combination thereof. The method of thinning the supportive substrate 10 can include but is not limited to Chemical Mechanical Polishing (CMP) or etching.

It should be noted that the proposed various embodiments are not for the purpose to limit the scope of the application. Any possible modifications without departing from the spirit of the application may be made and should be covered by the application.

What is claimed is:

1. A light-emitting structure, comprising:
   a supportive substrate;
   an anti-deforming layer for reducing the deformation of the light-emitting structure located on the supportive substrate;
   a bonding layer located on the anti-deforming layer; and
   a light-emitting stacked layer located on the anti-deforming layer, wherein the bonding layer connects the anti-deforming layer and the light-emitting stacked layer and the light-emitting stacked layer comprises at least an active layer;
   wherein a thickness of the supportive substrate is smaller than about 70 µm, and
   wherein the light-emitting structure is devoid of any substrate comprising a surface on which the light-emitting structure is grown.

2. The light-emitting structure as described in claim 1, wherein a material of the supportive substrate is selected from a group consisting of metal, electrical insulating material, composite material, metal matrix composite (MMC), ceramic matrix composite (CMC), Si, IP, ZnSe, AN, GaAs, SiC, GaP, GaAsP, Sapphire, ZnSe, ZnO, InP, $LiGaO_2$, $LiAlO_2$, and the combination thereof.

3. The light-emitting structure as described in claim 1, wherein the thickness of the supportive substrate is about 40 µm.

4. The light-emitting structure as described in claim 1, wherein a material of the anti-deforming layer is selected from a group consisting of $Al_xO_y$, $SiN_x$, $SiO_x$, $TiO_x$, GaN, and the combination thereof.

5. The light-emitting structure as described in claim 1, wherein the anti-deforming layer comprises a deposition defect of molecules or a microcosmic structure.

6. The light-emitting structure as described in claim 1, wherein a thickness of the anti-deforming layer is either smaller than about 10 µm or larger than about 2 µm.

7. The light-emitting structure as described in claim 1, wherein a material of the bonding layer is selected from a group consisting of PI, BCB, PFCB, Epoxy, other organic adhesive materials, In, Sn, Al, Au, Pt, Zn, Ag, Ti, Pb, Pd, Ge, Cu, Ni, AuSn, InAg, InAu, AuBe, AuGe, AuZn, PbSn, PdIn, and the combination thereof.

8. The light-emitting structure as described in claim 1 further comprising a reflective layer located between the light-emitting stacked layer and the bonding layer or between the anti-deforming layer and the light-emitting stacked layer.

9. The light-emitting structure as described in claim 8, wherein a material of the reflective layer is selected from a group consisting of In, Sn, Al, Au, Pt, Zn, Ag, Ti, Pb, Ge, Cu, Ni, AuBe, AuGe, AuZn, PbSn, the combination thereof, and DBR.

10. The light-emitting structure as described in claim 1, wherein the light-emitting stacked layer comprises a plurality of elements selected from a group consisting of Al, Ga, In, and P.

11. The light-emitting structure as described in claim 1 further comprises a protective layer located on the light-emitting stacked layer.

12. The light-emitting structure as described in claim 11, wherein a material of the protective layer is selected from a group consisting of dielectric material, Su8, BCB, PFCB, Epoxy, Acrylic Resin, COC, PMMA, PET, PC, Polyetherimide, Fluorocarbon Polymer, Silicone, Glass, $Al_xO_y$, SiOx, $SiN_x$, $TiO_x$, SOG, the combination thereof, and other transparent materials.

* * * * *